United States Patent [19]

Campbell et al.

[11] Patent Number: 4,631,566
[45] Date of Patent: Dec. 23, 1986

[54] LONG WAVELENGTH AVALANCHE PHOTODETECTOR

[75] Inventors: Joe C. Campbell, Middletown; Andrew G. Dentai, Atlantic Highlands, both of N.J.

[73] Assignee: AT&T Bell Laboratories, Murray Hill, N.J.

[21] Appl. No.: 525,455

[22] Filed: Aug. 22, 1983

[51] Int. Cl.$^4$ .................... H01L 27/14; H01L 31/00
[52] U.S. Cl. .................................... 357/30; 357/13; 357/16
[58] Field of Search ................ 357/30, 13, 16

[56] References Cited

U.S. PATENT DOCUMENTS 4,110,778  8/1978  Eden et al. ........................... 357/30
4,473,835  9/1984  Forrest et al. ........................ 357/30

OTHER PUBLICATIONS

Appl. Phys. Lett. 37(3), 1980, "$In_{0.53}Ga_{0.47}$..." by S. R. Forrest et al., pp. 322-325.
Appl. Phys. Lett. 35(3), Aug. 1979, "InGaAsP heterostructure..." by K. Nishida et al., pp. 251-253.
Appl. Phys. Lett. 39(5), Sep. 1981, "A high gain..." by O. K. Kim et al., pp. 402-404.
Appl. Phys. Lett. 41(1), Jul. 1982, "Optical response time..." by S. R. Forrest et al., pp. 95-98.
IEEE EDL, 1981, "New Type InGa/InP..." by Y. Matsushima et al., pp. 179-181.
Elec. Lett. 18(22), Oct. 28, 1982, "High-Speed-Response..." by Y. Matsushima et al., pp. 945-946.
Elec. Lett. 19(14), Jul. 7, 1983, "InGaAs Avalanche..." by T. Shirai et al., pp. 534-536.
Elec. Lett. 19(17), Aug. 18, 1983, "Incident Wavelength..." by K. Yasuda et al.
Press Release in Fiber Optics & Comm. Newsletter, Jul. 1983, Fujitsu Ltd.
Inst. Phys. Conf. Ser. No. 63, Chpt. 10, 1981, "LPE InGaAs/InP..." by A. G. Dentai et al., pp. 467-471.

Primary Examiner—William L. Sikes
Assistant Examiner—Georgia Y. Epps
Attorney, Agent, or Firm—Gregory C. Ranieri

[57] ABSTRACT

High speed, high quantum efficiency, low dark current, and avalanche gain greater than 10 are exhibited by a long wavelength avalanche photodetector including in succession a terminal region of p-type indium phosphide (InP) a multiplication region comprising first and second layers of n-type indium phosphide (InP), a grading layer of n-type indium gallium arsenide phosphide (InGaAsP), and an absorption region of n-type indium gallium arsenide (InGaAs).

7 Claims, 3 Drawing Figures

LONG WAVELENGTH AVALANCHE PHOTODETECTOR

TECHNICAL FIELD

This invention relates to a semiconductor device and, more particularly, to a long wavelength avalanche photodiode with separate absorption, grading and multiplication regions and to a method of making the same.

BACKGROUND OF THE INVENTION

Development of avalanche photodetectors for long wavelength (1.0 $\mu m \leq \lambda \leq 1.65$ $\mu m$) high bit rate communication systems has been impeded by the presence of an excessive amount of dark current. Excessive dark current, especially the tunneling component thereof, is a significant source of detector noise. The tunneling component of the dark current is enhanced by the high electric fields required to produce avalanche gain. For an explanation of the tunneling component of dark current in long wavelength avalanche photodiodes, see S. R. Forrest et al., *Appl. Phys. Lett.*, 37(3), pp. 322–5 (1980).

In an effort to substantially eliminate the tunneling component of the dark current, the structure of long wavelength avalanche photodetectors employing a ternary or quaternary Group III-V semiconductor compound has been modified to include separate regions for multiplication and absorption. These separate regions accommodate a high avalanche field and a low interface field to reduce the tunneling current. One such avalanche photodiode employing a multiplication region of InP and a separate absorption region of InGaAsP has been demonstrated by K. Nishida et al. in *Appl. Phys. Lett.*, 35(3), pp. 251–3 (1979). Similarly, O. K. Kim et al. have shown an avalanche photodetector structure including a multiplication region of InP and a separate absorption region of InGaAs in *Appl. Phys. Lett.*, 39(5), pp. 402–4 (1981).

While separate absorption and multiplication region avalanche photodetectors have improved dark current characteristics, these photodetectors exhibit a frequency response which is slower than desired. This response is limited by a slow transient response which is attributed to an accumulation of charge at the valence band discontinuity between the multiplication and absorption regions, i.e., at the heterojunction interface.

To reduce the charge accumulation at the heterojunction interface, S. Forrest et al. in *Appl. Phys. Lett.*, 41(1), pp. 95–8 (1982) have suggested compositional grading of the heterojunction interface over a distance of 600 to 1000 angstroms thereby reducing the valence band discontinuity.

A subset of the above-described technique for reducing the charge accumulation is growth of an intermediate bandgap, grading layer between the wide bandgap, multiplication region and the narrow bandgap, absorbing region. Although such a structure has valence band discontinuities, these discontinuities are relatively small. Y Matsushima et al. in *IEEE Electron Device Letters*, Vol. EDL-2, No. 7, pp. 179–181 (1981) show the use of three quaternary layers (InGaAsP) to form the grading region. Each quaternary layer increases in bandgap from the layer adjacent to the absorbing region to the layer adjacent to the multiplication region. The quaternary layer adjacent to the absorption region has a bandgap of 0.8 eV ($\lambda_g = 1.55$ $\mu m$), the middle quaternary layer has a bandgap of 0.95 eV ($\lambda_g = 1.3$ $\mu m$); and the quaternary layer adjacent to the multiplication region has a bandgap of 1.08 eV ($\lambda_g = 1.15$ $\mu m$). Matsushima et al. in *Elect. Lett.*, Vol. 18, No. 22, pp. 945–6 (1982) show the use of two quaternary layers in proper bandgap sequence to form the grading region. In the latter avalanche photodetector, the quaternary layer adjacent to the absorption region has a bandgap of 0.8 eV ($\lambda_g = 1.55$ $\mu m$) whereas the quaternary layer adjacent to the multiplication region has a bandgap of 0.95 eV ($\lambda_g = 1.3$ $\mu m$).

While Matsushima et al. claim an improved pulse response, via reduced charge accumulation at the heterojunction interface, for the photodetector including the two quaternary layers as the grading layer, it is evident that the device is incapable of both operating with high quantum efficiency and providing high speed response (>200 MHz) because the device is unable to achieve both high light absorption and rapid carrier transport in the absorption region simultaneously.

From the descriptions given above, it is clear that avalanche photodetectors for high speed communication should have the properties of low dark current, high quantum efficiency, and rapid response time. In order to achieve these properties, device designers must provide a structure which accommodates a high avalanche field, a low interface field, and a depleted absorption region.

SUMMARY OF THE INVENTION

High speed (e.g., >1 GHz), high quantum efficiency (e.g., >60 percent), low dark current (e.g., >100 nA at avalanche gain of 10), and high avalanche gain (e.g., >10) are simultaneously exhibited by a long wavelength, avalanche photodetector including in succession a terminal region of first conductivity type semiconductor material, a multiplication region comprising first and second layers of a second conductivity type semiconductor material, and an absorption region of a second conductivity type semiconductor material. The bandgap of the absorption region is less than the bandgap of the multiplication region.

In one embodiment, the photodetector includes in succession a terminal region of p-type indium phosphide (InP) a multiplication region comprising first and second layers of n-type indium phosphide (InP), a grading layer of n-type indium gallium arsenide phosphide (InGaAsP), and an absorption region of n-type indium gallium arsenide (InGaAs).

Additionally, in a separate aspect of the present invention, it has been found that carrier concentration for at least the multiplication region is preferably made uniform and is capable of being held in a reproducible manner within a range having narrow tolerances by baking out the n-type indium phosphide melt to substantially reduce the background (donor) carrier concentration and, then, by adding a sufficient amount of n-type dopant such as tin (Sn) to achieve the desired carrier concentration level.

Furthermore, it is to be understood that the regions may comprise other semiconductors such as Group III-V or Group II-VI compounds. In addition, the conductivity type of each region may be reversed, i.e., p-type for n-type and n-type for p-type. Moreover, the grading layer may be omitted if the energy band discontinuities do not lead to charge storage effects which significantly affect response times.

BRIEF DESCRIPTION OF THE DRAWINGS

A more complete understanding of the invention may be obtained by reading the following description of a specific illustrative embodiment of the invention in conjunction with the appended drawing in which.

DETAILED DESCRIPTION

Figure 1:
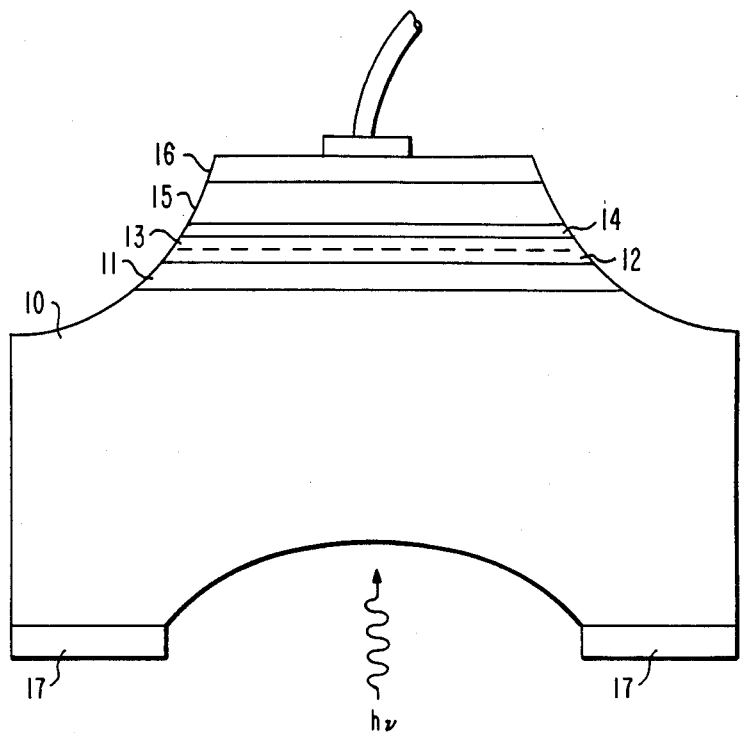
FIG. 1 is an illustrative embodiment of long wavelength, avalanche photodetector fabricated in accordance with the present invention.

FIG. 1 is a cross-sectional view of a back-illuminated separate absorption and multiplication region avalanche photodetector. For convenience, the photodetector in FIG. 1 is not drawn to scale. In the description which follows, the phrase grading layer is used. The term "grading" is understood to mean either one or more layers of uniform composition throughout the thickness of the layer or one or more layers of varying composition and intermediate bandgap.

For purposes of explanation and not for purposes of limitation the following description is based upon the use of Group III-V semiconductor compounds for the photodetector. It will be apparent to those skilled in the art that the principles of the present invention apply with equal force to other semiconductors such as Group III-V or Group II-VI compounds.

Liquid phase epitaxy is used to grow the various semiconductor layers of the photodetectors. Growth preferably is carried out in a well-controlled reactor such as a computer controlled, vertical, liquid phase epitaxy reactor.

In FIG. 1, substrate layer 10 is a terminal region of the avalanche photodetector. Substrate layer 10 is comprised of p-type InP uniformly doped with a p-type dopant such as manganese to a concentration of about $10^{15}$ atoms per cm$^3$. Substrate layer 10 is cut and aligned for a (100) orientation.

On the (100) surface of layer 10 is grown, by known liquid phase techniques, a buffer layer 11 of p-type epitaxial layer of InP about 1.0 to 5.0 microns in thickness. Buffer layer 11 is preferably doped with a p-type dopant such as zinc to a concentration less than $10^{19}$ atoms per cm$^3$. For example, a concentration of $7 \times 10^{18}$ atoms per cm$^3$ is satisfactory.

Figure 2:
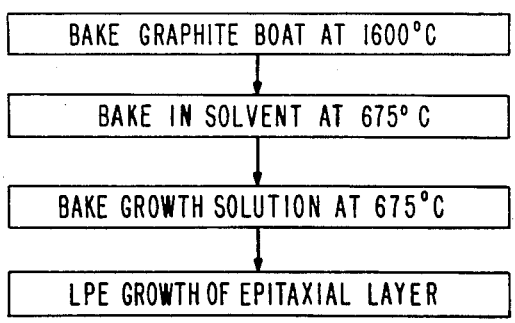
FIG. 2 is a flowchart of steps in the method for achieving a desired uniform carrier concentration.

Following the growth of buffer layer 11, the multiplication region is grown comprising first multiplication layer 12 and second multiplication layer 13. Layers 12 and 13, shown in FIG. 1 separated by a dashed line, are separate, substantially similar, n-type InP, epitaxial layers uniformly doped with an n-type dopant such as tin to a concentration of approximately $10^{16}$ atoms per cm$^3$. The compositions are substantially identical. The carrier concentrations are substantially similar, i.e., they differ by no more than an order of magnitude. Dissimilar carrier concentrations require adjustment of the layer thicknesses for layers 12 and 13. For example, a concentration of $1.5 \times 10^{16}$ atoms per cm$^3$ is satisfactory. The combined thickness of layers 12 and 13 is less than 3.0 microns and is desirably equal to 1.5 microns. The layer thicknesses and doping concentrations are selected to achieve a high avalanche field, a low interface field, and a depleted absorption region. While known liquid phase epitaxial techniques may be employed to grow layers 12 and 13, the preferred liquid phase technique provides better results and is shown in FIG. 2 to be discussed below.

Next, grading layer 14 is grown by known liquid phase techniques on the multiplication region. Grading layer 14 comprises an n-type epitaxial layer of $In_{1-x}Ga_xAs_{1-y}P_y$ having a thickness less than 1.0 micron and preferably equal to 0.3 microns. Doping of grading layer 14 is accomplished with an n-type dopant such as tin to a donor concentration of $1.5 \times 10^{16}$ to $2.0 \times 10^{16}$ atoms per cm$^3$. For layer 14, the elements of the quaternary compound can be used in varying proportions provided that the resulting bandgap is graded, stepped or constant region is narrower than the bandgap of the multiplication region and wider than the bandgap of the absorption region. The values of x and y are selected to achieve lattice matching to the InP multiplication layer and to provide an intermediate bandgap. In one example, the value of composition ratio x is approximately 0.3 whereas the value of composition ratio y is approximately 0.35.

The final layer to be grown by liquid phase techniques, preferably employing the method shown in FIG. 2 below, is absorption layer 15 which comprises the absorption region of the avalanche photodetector. Absorption layer 15 is an n-type epitaxial layer of $In_{1-z}Ga_zAs$ having a thickness greater than 5 microns. The background carrier (donor) concentration level is desirably less than $7 \times 10^{15}$ atoms per cm$^3$. Composition ratio z of layer 15 is chosen to result in a bandgap which is smaller than the energy of photons to be absorbed. One exemplary composition ratio z for layer 15 is 0.47.

To reduce capacitance and edge field effects, it is desirable to shape the resulting diode into a back-illuminated, mesa structure as shown in FIG. 1. Typically, the mesa and illumination well are defined by standard photolithographic and chemical etching techniques which are well known to those skilled in the art. Etchants such as dilute (1%) bromine-methanol are suitable for defining the mesa structure. A circular area of about 80 microns in diameter is typical for the top and bottom surfaces.

Low resistance connections 16 and 17 are made to absorption layer 15 and substrate layer 10, respectively, by means of alloyed electrodes. In one specific embodiment, gold-tin was used for electrode 16 to contact layer 15 and gold-indium-zinc was used as electrode 17 to contact layer 10. In operation, an appropriate electric field is imposed between electrode 16 and 17 to create a reverse bias on the diode and, thereby, achieve the desired avalanche operation.

In optimization of the layer thicknesses and carrier concentrations for the avalanche photodetector, it is important to realize the interdependence of the various layers. First, avalanche gain is achieved by a sufficiently high electric field in the multiplication region (layers 12 and 13). However, the electric field in the absorbing region (layer 15) should be sufficiently low to avoid any significant tunneling effect from the dark current. Second, it is necessary for the depleted portion of the absorption region (layer 15) to be sufficiently wide to provide drift-limited response and high quantum efficiency. Hence, there are narrow tolerances on the thickness and carrier concentration of each layer from the multiplication region, through the grading layer and to the absorption region. See, for example, O. K. Kim et al., *Appl. Phys. Lett.*, 39(5), pp. 492–4 (1981). In order to meet these tolerances and in accordance with the aspects of this invention, the multiplication region is comprised of two substantially similarly doped layers which are compositionally identical to permit greater control of the thickness of the region and care is taken during the growth process to reduce the background carrier concentration of at least the multiplication region to a concentration which is less than 50 percent of a desired doping level. In one example, the background carrier concentration is reduced to at least one low $10^{15}$ atoms per cm$^3$ range. As a result of this procedure, doping of the multiplication region back up to a desired level eliminates doping variations due to random fluctuations of the background impurity concentration to yield reproducible doping (carrier concentration) levels.

FIG. 2 illustrates the steps of a method incorporated in a standard liquid phase epitaxial growth process for achieving a desired uniform carrier concentration. This method eliminates doping variations caused by random fluctuations of the background impurity concentration and permits a desired concentration level to be obtained in a reproducible manner. The method includes two key phases: a "bakeout" phase to eliminate residual impurities and reduce the background carrier concentration and a "back-doping" phase to bring the carrier concentration back up to a desired level. The bakeout phase has been described with respect to InGaAs in A. G. Dentai et al., *Inst. Phys. Conf.* Ser. No. 63, Chap. 10, pp. 467–471 (1982) presented at Int. Symp. GaAs and Related Compounds, Japan (1981). For ease of explanation and not for purposes of limitation, the steps shown in FIG. 2 pertain to an exemplary procedure performed on n-type InP.

First, baking of the graphite boat used in the liquid phase epitaxial growth reactor is performed at high temperature, approximately 1600 degrees Centigrade, in a vacuum for a substantially long period of time such as 72 hours. Then, indium is placed in the baked graphite boat and the indium solvent is baked at approximately 675 degrees Centigrade for a period of time approximately equal to 16 hours. Next, the growth solution (Group III-V compound and donor substance such as tin) is baked in the graphite boat for approximately the same length of time at approximately 675 degrees Centigrade. It is desirable also to utilize starting materials (indium) having a very low concentration of silicon, on the order of 0.02 to 0.03 ppm. Finally, the purified substances and apparatus are employed in the liquid phase epitaxial growth of the n-type InP layer wherein tin, added as an impurity to the Group III-V compound, brings the donor concentration level of the layer up to the desired level.

The method described above is equally applicable to the growth of ternary and quaternary layers such as layers 15 and 14, respectively.

Figure 3:
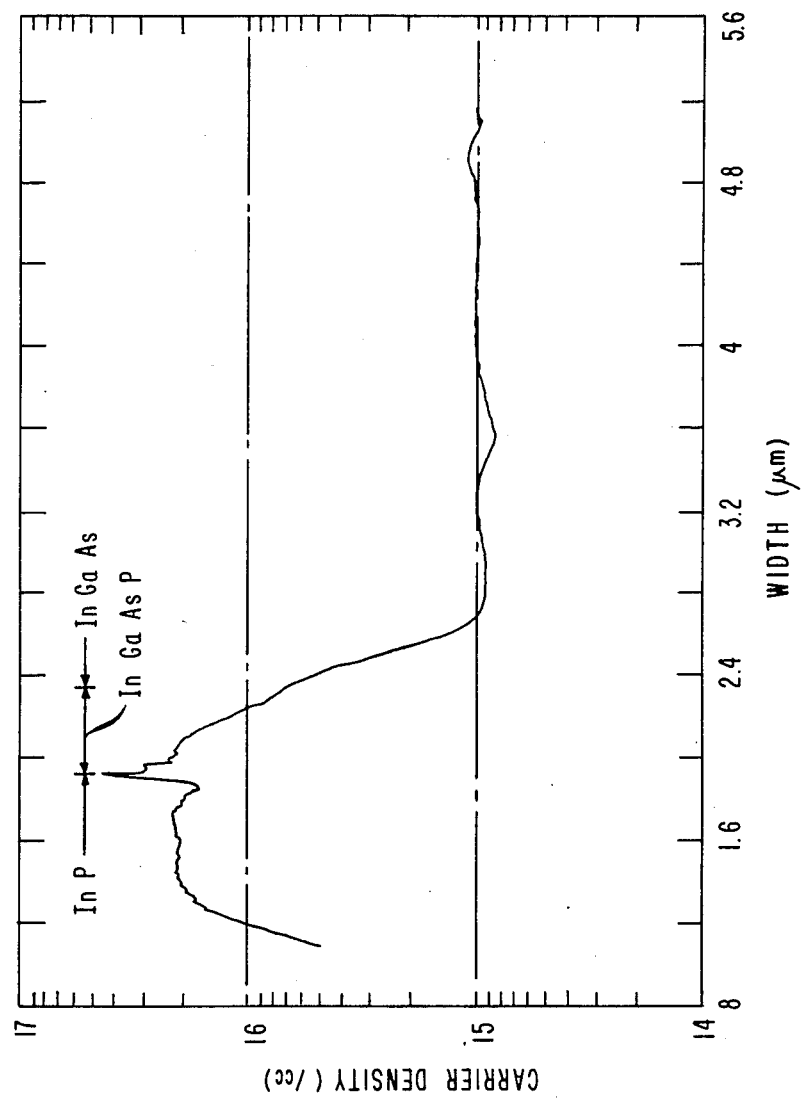
FIG. 3 is a carrier density profile of the n-type regions for the photodetector of FIG. 1.

FIG. 3 shows an exemplary carrier density profile obtained by capacitance-voltage measurements.

From analysis of the long wavelength photodetectors fabricated in accordance with the principles of this invention, the characteristics of these photodetectors are as follows. At an avalanche gain of 10, the photodetectors show a 10 percent to 90 percent rise time of 100 ps and a falltime of 300 ps. Frequency response measurements show that the 3 dB bandwidth is 1 GHz at an avalanche gain of 10 and 2 GHz at an avalanche gain of 5. This implies that the gain bandwidth product is about 10 GHz. At 50 percent and 90 percent of the avalanche breakdown voltage, the dark current is approximately 11 nA and 35 nA, respectively. For an avalanche gain of 37, the multiplied dark current is at least as low as 150 nA. Measured quantum efficiency of the photodetectors without an antireflection coating is 68 percent at 1.3 μm and 1.5 μm. The theoretical maximum quantum efficiency for these photodetectors is 70 percent.

It will be apparent to those skilled in the art that other techniques and geometries can be used for fabrication including, for example, molecular beam epitaxy or chemical vapor deposition such as halide transport and metal-organic chemical vapor deposition and the like. Similarly, it is feasible that the conductivity type of each layer be reversed, that is, p-type for n-type for p-type. The design considerations discussed above are similarly applicable. In addition, while a mesa geometry has been specifically described, a planar geometry may in some instances be preferred. Moreover, other substrate orientations are contemplated.

It is to be understood that other well-known p-type or n-type dopants may be used. Additionally Group II-VI compound semiconductors may also be used. Furthermore, if the absorption and multiplication regions comprise semiconductor materials such that most of the bandgap difference between the two regions results from the difference in the levels of the conductor band, i.e., the volume bands are at the same level, the grading region may be omitted.

What is claimed is:

1. In a semiconductor device including in succession a first conductivity type terminal region, a second conductivity type multiplication region, a second conductivity type grading region, and a second conductivity type absorption region, each region being comprised of semiconductor material, the device being characterized in that the multiplication region is comprised of a first multiplication layer and a second multiplication layer, both multiplication layers being substantially identical with respect semiconductor composition and substantially similar with respect to carrier concentration.

2. The combination as defined in claim 1 further characterized in that each region is comprised of a semiconductor material selected from Group III-V and Group II-VI compounds and Group IV elements.

3. The combination as defined in claim 2 being further characterized in that the terminal region and both multiplication layers are comprised of indium phosphide, the grading region is comprised of indium gallium arsenide phosphide, and the absorbing region is comprised of indium gallium arsenide.

4. The combination as defined in claim 3 further characterized in that the first conductivity type is p-type and the second conductivity type is n-type and the terminal region is comprised of both a substrate layer and a buffer layer.

5. In a semiconductor device, a combination including in succession a first conductivity type terminal region, a second conductivity type multiplication region, and a second conductivity type absorption region, each region being comprised of a semiconductor selected from the group of Group III-V and Group II-VI compounds and Group IV elements, the device being characterized in that the multiplication region has a background carrier concentration of less than fifty percent of a predetermined desired doping concentration and the multiplication region is comprised of a first multiplication layer and a second multiplication layer, both multiplication layers being substantially identical with respect to semiconductor composition and substantially similar with respect to carrier concentration.

6. The combination as defined in claim 5 being further characterized in that the terminal region and both multiplication layers are comprised of indium phosphide, and absorbing region is comprised of indium gallium arsenide and a grading region between the absorption and multiplication regions is comprised of indium gallium arsenide phosphide.

7. The combination as defined in claim 6 further characterized in that the first conductivity type is p-type and the second conductivity type is n-type and the terminal region is comprised of a substrate layer and a buffer layer.

* * * * *